(12) United States Patent
Balakumar et al.

(10) Patent No.: US 7,095,073 B2
(45) Date of Patent: Aug. 22, 2006

(54) HIGH K ARTIFICIAL LATTICES FOR CAPACITOR APPLICATIONS TO USE IN CU OR AL BEOL

(75) Inventors: Subramanian Balakumar, Singapore (SG); Chew Hoe Ang, Singapore (SG); Jia Zhen Zheng, Singapore (SG); Paul Proctor, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 50 days.

(21) Appl. No.: 10/972,551

(22) Filed: Oct. 25, 2004

(65) Prior Publication Data

US 2005/0118780 A1 Jun. 2, 2005

Related U.S. Application Data

(63) Continuation of application No. 10/286,627, filed on Nov. 2, 2002, now Pat. No. 6,830,971.

(51) Int. Cl.
*H01L 29/76* (2006.01)
(52) U.S. Cl. ........................ 257/310; 257/774
(58) Field of Classification Search ................ 257/310, 257/774, 298
See application file for complete search history.

(56) References Cited

U.S. PATENT DOCUMENTS

| | | | | |
|---|---|---|---|---|
| 5,519,234 A | * | 5/1996 | Paz de Araujo et al. | 257/295 |
| 5,976,928 A | | 11/1999 | Kirlin et al. | 438/240 |
| 6,117,747 A | | 9/2000 | Shao et al. | 438/396 |
| 6,166,423 A | | 12/2000 | Gambino et al. | 257/532 |
| 6,218,079 B1 | | 4/2001 | Shin et al. | 430/314 |
| 6,271,082 B1 | | 8/2001 | Hou et al. | 438/250 |

* cited by examiner

*Primary Examiner*—Richard A. Booth
(74) *Attorney, Agent, or Firm*—Saile Ackerman LLC; Stephen B. Ackerman

(57) ABSTRACT

An improved and new process of fabricating high dielectric constant MIM capacitors. These high dielectric constant MIM capacitor met all of the stringent requirements needed for both for both RF and analog circuit applications. For the high dielectric constant MIM capacitor, the metal is comprised of copper electrodes in a dual damascene process. The dielectric constant versus the total thickness of super lattices is controlled by the number of layers either 4/4, 2/2, and 1/1 artificial layers. Hence thickness of the film can be easily controlled. Enhancement of dielectric constant is because of interface. Dielectric constants near 900 can be easily achieved for 250 Angstrom thick super lattices. MBE, molecular beam epitaxy or ALCVD, atomic layer CVD techniques is used for this type layer growth process.

8 Claims, 5 Drawing Sheets

*Dielectric Constant (K) vs. Stacks*

Dielectric Constant K vs. Total Thickness (Å) Stacks

△ = 2/2 Unit Stack
● = 1/1 Unit Stack
■ = 4/4 Unit Stack
□ = Solid State SBTO soli RHEED Intensity Data vs. Time (min) for 3 Unit Cells/3 Unit Cells Stacking

HIGH K ARTIFICIAL LATTICES FOR CAPACITOR APPLICATIONS TO USE IN CU OR AL BEOL This is a continuation of patent application Ser. No. 10/286,627, filing date Nov. 2, 2002, now U.S. Pat. No. 6,830,971 High K Artificial Lattices For Capacitor Applications To Use In Cu Or Al Beol, assigned to the same assignee as the present invention, which is herein incorporated by reference in its entirety.

BACKGROUND OF THE INVENTION

1. Field of the Invention

This invention relates to a method of fabrication used for semiconductor integrated circuit devices, and more specifically to the formation of high dielectric constant MIM capacitors, using copper electrodes in a damascene process, and forming alternating layers of high dielectric artificial super lattices by depositing high dielectric material by MBE, molecular beam epitaxy or ALCVD, atomic layer CVD techniques.

2. Description of Related Art

In this section a description of related Prior Art background patents follows.

U.S. Pat. No. 6,218,079 B1 entitled "Method For Metallization By Dual Damascene Process Using Photosensitive Polymer" granted Apr. 17, 2001 to Shin et al. describes a copper dual damascene process with high dielectric constant silicon nitride. A photosensitive polymer having low permittivity is used as an etch mask. Though the etch mask remains in the final structure, its low permittivity reduces parasitic capacitance effects. In this method, a photosensitive polymer pattern having a first hole with a first width is formed on a first interlayer dielectric film. A second interlayer dielectric film is formed on the photosensitive polymer pattern. A mask pattern, having a second hole, above the first hole, with a second width larger than the first width, is formed on the second interlayer dielectric film. A wiring region is formed by dry-etching the second interlayer dielectric film using the mask pattern as an etch mask. A via hole region is formed by dry-etching the first interlayer dielectric film using the photosensitive polymer pattern as an etch mask.

U.S. Pat. No. 5,976,928 entitled "Chemical Mechanical Polishing of FERAM Capacitors" granted Nov. 2, 1999 to Kirlin et al. shows a dual damascene process with a high dielectric constant ferroelectric capacitor structure. The capacitor structure is formed by sequentially depositing a bottom electrode layer, a ferroelectric layer and a top electrode layer on a base structure, optionally with deposition of a layer of a conductive barrier material beneath the bottom electrode layer. Planarization of the capacitor precursor structure by chemical mechanical polishing yields the ferroelectric capacitor structure: a stack capacitor or trench capacitor. The process is carried out without dry etching of the electrode layers or dry etching of the ferroelectric layer, to yield ferroelectric capacitors having a very small feature size, between 0.10 and 0.20 microns.

U.S. Pat. No. 6,117,747 entitled "Integration Of MOM Capacitor Into Dual Damascene Process" granted Sep. 12, 2000 to Shao et al. describes a dual damascene and MOM process for fabricating a metal-oxide-metal capacitor. A dielectric layer is provided overlying a semiconductor substrate. A dual damascene opening in the dielectric layer is filled with copper to form a copper via underlying a copper line. A first metal layer is deposited overlying the copper line and patterned to form a bottom capacitor plate contacting the copper line. A capacitor dielectric layer is deposited overlying the bottom capacitor plate. A second metal layer is deposited overlying the capacitor dielectric layer and patterned to form a top capacitor plate to complete fabrication of a metal-oxide-metal capacitor.

U.S. Pat. No. 6,271,082 B1 entitled "Method of Fabricating A Mixed Circuit Capacitor" granted Aug. 7, 2001 to Hou et al. reveals a dual damascene and capacitor process for fabricating a capacitor for a mixed circuit application. The method involves forming a first dielectric layer, a stop layer, and a second dielectric layer on a substrate having a conductive region. A first opening is then formed in the second dielectric layer, followed by forming a second opening in the stop layer and the first dielectric layer, so that the first opening and the second opening form a dual damascene opening for exposing the conductive region. The dual damascene opening is filled with a first conductive layer, so as to form a via plug and a lower electrode of the capacitor for connecting to the conductive region. A third dielectric layer, which is located between the lower electrode and a subsequent formed upper electrode, is then formed over the substrate, so that the lower electrode and a part of the second dielectric layer adjacent to the lower electrode are completely covered by the third dielectric layer. A patterned second conductive layer is formed on a part of the third dielectric layer, whereby an upper electrode for completely covering the lower electrode is formed.

U.S. Pat. No. 6,166,423 entitled "Integrated Circuit Having A Via And A Capacitor" granted Dec. 26, 2000 to Gambino et al. describes a capacitor process for manufacturing a capacitor simultaneously while forming a dual damascene via. A first interconnect layer is formed upon a first interlevel dielectric. Openings corresponding to vias and capacitors extend through a second interlevel dielectric to the first interconnect layer. A conductor is deposited in the via openings. An insulator is deposited in the openings and on the conductor in the via openings. A trench is then etched into the upper portion of the via openings while simultaneously removing the insulator from the conductor in the via openings. A conductor is then deposited in the openings and in the trenches and chemical mechanical polishing (CMP) is used to pattern the conductor. A third interlevel dielectric is then deposited, openings are formed extending to the conductors, and third interconnect layer conductors are deposited and patterned.

As a background to the present invention, existing dielectric materials are reaching their limits due to pitch size reduction and changes in capacitor architecture. The combination of hemispherical polysilicon grains (HSG) and nitride is already showing strains at 130 nm technology, and reaching to and beyond 100 nm technology, will require new dielectrics and eventually the transition to MIM capacitor structures. Furthermore, the low cost manufacturing nature of the memory business, and the extreme reluctance to change anything that is not absolutely necessary, makes for the integration of any new technology a major challenge. Chip manufacturers are looking for capacitors that have higher dielectric constant materials to replace silicon oxynitride, beginning with the 130 nm generation, and on a larger scale at 100 nm.

SUMMARY OF THE INVENTION

For future applications in RF integrated circuits in the back end of line, BEOL, the present invention describes a method of fabricating high dielectric constant MIM, metalinsulator-metal capacitors. In addition, the high dielectric constant MIM capacitors have the following desirable properties: low voltage coefficients, precise control of capacitor values for ease of matching, small parasitic capacitance, along with high reliability and low defect densities. These high dielectric constant MIM capacitor met all of the stringent requirements needed for both for both RF and analog circuit applications.

For the high dielectric constant MIM capacitor, the metal is comprised of copper electrodes, since the low resistance of copper can increase the inductor quality or Q-factor, compared to that of aluminum, and coupled with dielectrics of nitride help to reduce both the MIM capacitor area and reduce substrate coupling, as compared to that of silicon oxide. A high K dielectric between the MIM electrodes minimizes the capacitor area requirement. To reduce capacitor space and obtain a high dielectric constant with less thickness, a novel, artificial super lattice is described by the present invention, selected from the group consisting of: $Ta_2O_5$—$HfO_2$, $Ta_2O_5$—$ZrO_2$, artificial hybrid lattices, both ferroelectric and antiferroelectric artificial super lattices, which form "stacks" or layers of alternating dielectric, achieving high dielectric constants, used in MIM, metal-insulator-metal, capacitor applications. The super lattices exhibit very high dielectric constants at short stacking periodicity of each layer due to the displacement of lattice ions. Good adhesion of $HfO_2$ on a layer SiN, silicon nitride, is achieved when $HfO_2$ is used as the bottom, starting stack material in the preparation of a super lattice.

To increase or decrease dielectric constant, the stacking periodicity is changed. The combination of the functional layers in the atomic scale leads to the formation of new compounds. Hence this technique is highly useful in the construction of capacitors using two different materials, or multiple component systems.

This artificial super lattice approach is one of the promising ways for the fabrication of capacitors such as MIM, which can have stable layers with very high dielectric constants. Conventional solid solutions may have regions that are non-homogeneous and that can cause very high leakage currents. This artificially structured thin films approach of the present invention yields novel dielectric properties compared with conventional thin films, and methods described in the present invention can be easily employed in Cu-BEOL, copper back end of line. Key in MIM capacitors, the dielectric loss must be extremely small and the series resistance of the wiring should be minimized for high frequency applications. This indicates it is desirable to use short interconnect wires with low specific resistance.

Further embodiments of the present invention include ferroelectric and anti-ferroelectric based capacitors. There are some more materials having very high dielectric constants which are also be used in present invention, with high dielectric constant properties based on film or layer growth temperature. These super lattices yield high dielectric constant, based on the stacking periodicity and number of unit cells. The first group of high dielectric constant materials is selected from the group consisting of: $BaTiO_3/SrTiO_3$. The second group of high dielectric constant materials is selected from the group consisting of: $BaTiO_3/BaHfO_3$, $BaTiO_3/BaZrO_3$, with ease of preparation to achieve high dielectric constants. The third group of high dielectric constant materials is selected from the group consisting of: $Ba_{0.5}Sr_{0.5}TiO_3$, with layering stack of $[(BaTiO_3)4/(SrTiO_3)4]_4$. The dielectric constant versus the total thickness of the super lattices is controlled by the number of layers. MBE, molecular beam epitaxy or ALCVD, atomic layer CVD techniques is used for this type layer growth process.

In accordance with the present invention, the above and other objectives are realized by using a method of fabricating a This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include:

FIG. 1A, graphs dielectric constant, K, versus several titanate stacking dielectrics, FIG. 1B, graphs dielectric constant, K, versus total dielectric thickness of various titanate dielectrics, FIG. 1C, illustrates a dielectric super lattice, FIG. 1D, graphs RHEED oscillation intensity versus time during growth of a super lattice.

DESCRIPTION OF THE PREFERRED EMBODIMENTS

Figure 1A:
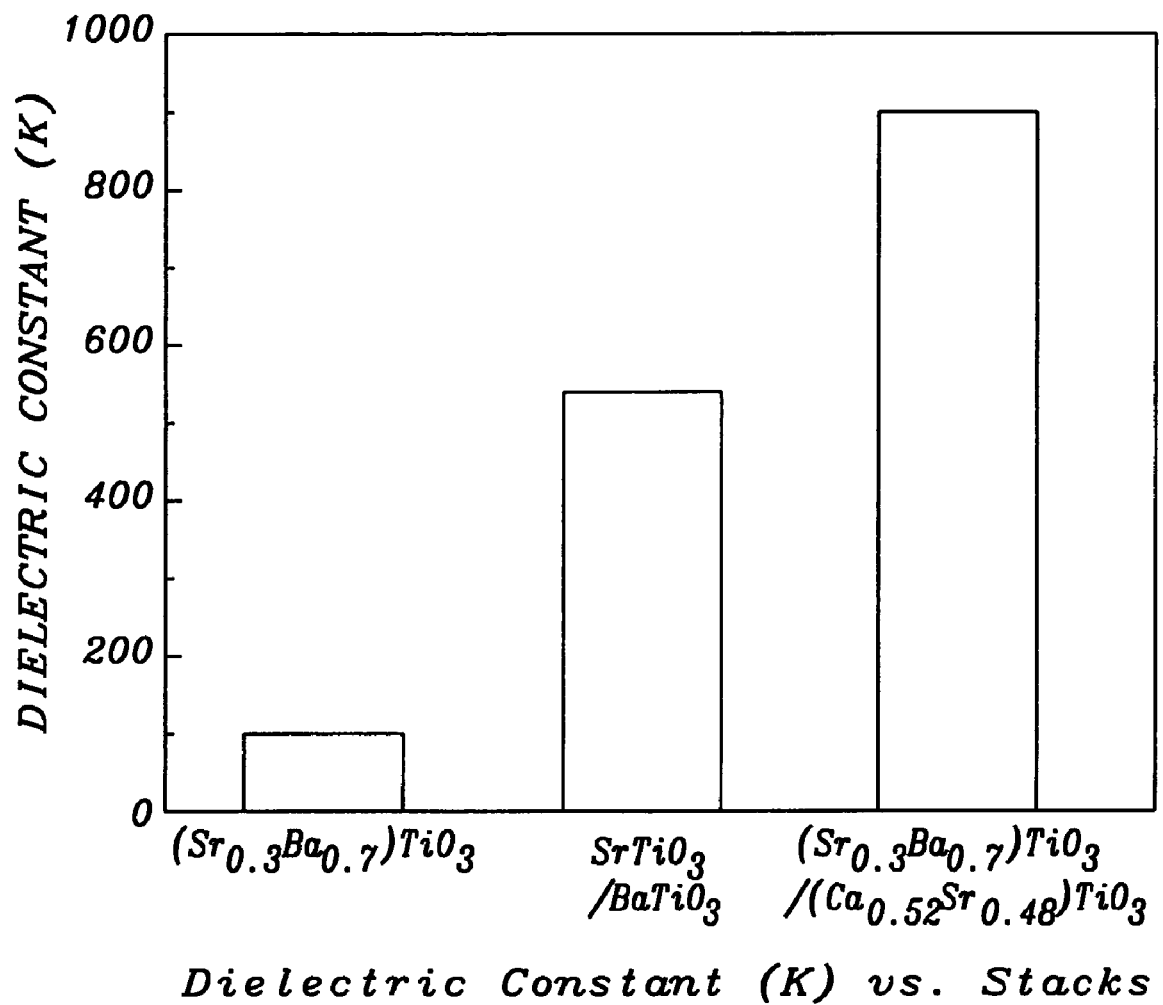
FIGS. 1A–1D, illustrate several key features of the present invention.

The new and improved method of using high dielectric constant MIM, metal-insulator-metal capacitors for future high frequency applications in RF, integrated circuits will now be described in detail. The present invention describes a method of fabricating high dielectric constant MIM, metal-insulator-metal capacitors. In addition, the high dielectric constant MIM capacitors have the following desirable properties: low voltage coefficients, precise control of capacitor values for ease of matching, small parasitic capacitance, along with high reliability and low defect densities. These high dielectric constant MIM capacitor met all of the stringent requirements needed for both for both RF and analog circuit applications.

For the high dielectric constant MIM capacitor, the metal is comprised of copper electrodes, since the low resistance of copper can increase the inductor quality or Q-factor, compared to that of aluminum, and coupled with dielectrics of nitride help to reduce both the MIM capacitor area and reduce substrate coupling, as compared to that of silicon oxide. A high K dielectric between the MIM electrodes minimizes the capacitor area requirement. To reduce capacitor space and obtain a high dielectric constant with less thickness, a novel, artificial super lattice is described by the present invention, selected from the group consisting of: $Ta_2O_5/HfO_2$, $Ta_2O_5/ZrO_2$, artificial hybrid lattices, both ferroelectric/antiferroelectric artificial super lattices, which form "stacks" or layers of alternating dielectric, achieving high dielectric constants, used in MIM, metal-insulator-metal, capacitor applications. The super lattices exhibit very high dielectric constants at short stacking periodicity of each layer due to the displacement of lattice ions. Good adhesion of $HfO_2$ on a layer SiN, silicon nitride, is achieved when $HfO_2$ is used as the bottom, starting stack material in the preparation of a super lattice.

To increase or decrease dielectric constant, the stacking periodicity is changed. The combination of the functional layers in the atomic scale leads to the formation of new compounds. Hence this technique is highly useful in the construction of capacitors using two different materials, or multiple component systems.

This artificial super lattice approach is one of the promising ways for the fabrication of capacitors such as MIM, which can have stable layers with very high dielectric constants. Conventional solid solutions may have regions that are non-homogeneous and that can cause very high leakage currents. This artificially structured thin films approach of the present invention yields novel dielectric properties compared with conventional thin films, and methods described in the present invention can be easily employed in Cu-BEOL, copper back end of line. Key in MIM capacitors, the dielectric loss must be extremely small and the series resistance of the wiring should be minimized for high frequency applications. This indicates it is desirable to use short interconnect wires with low specific resistance.

To build copper based capacitors, in a dual damascene process, a simple process flow is as follows: silicon nitride deposition, PE plasma enhanced TEOS, tetraethoxysilane deposition, dual damascene etch, barrier deposition, artificial lattices deposition using ALCVD, atomic layer CVD, or MBE, molecular beam epitaxy, and copper deposition. The formation of the capacitor inside the trench reduces space and it is easy to prepare using super lattices since it is conformal growth. Note, depending on the particular method of to be used to form a dual damascene opening, the low dielectric constant dielectric mentioned above, in the tetraethoxysilane deposition, can consist of a multiple layers of alternating dielectric with etch stop layers. Low dielectric constant material is selected from the group consisting of: PE TEOS, plasma enhanced tetraethoxysilane deposition, SiN, SiO, SOG spin-on-glass halogenated SiO, fluorinated silicate glass FSG, in a thickness range from 1000 to 10000 Angstroms.

Further embodiments of the present invention include ferroelectric and anti-ferroelectric based capacitors. There are some more materials having very high dielectric constants which are also be used in present invention, with high dielectric constant properties based on film or layer growth temperature. These super lattices yield more than 500 dielectric constant, based on the stacking periodicity and number of unit cells. The first group of high dielectric constant materials is selected from the group consisting of: $BaTiO_3$/$SrTiO_3$. The second group of high dielectric constant materials is selected from the group consisting of: $BaTiO_3$/$BaHfO_3$, $BaTiO_3$/$BaZrO_3$, with ease of preparation to achieve high dielectric constants, and with the thickness of each compound being varied from approximately 4 to 250 Angstroms.

The third group of high dielectric constant materials is selected from the group consisting of: 50 atomic percent of barium and 50 atomic percent of strontium forming $Ba_{0.5}Sr_{0.5}TiO_3$, with layering stack of $[(BaTiO_3)4/(SrTiO_3)4]_4$ The dielectric constant versus the total thickness of super lattices is controlled by the number of layers either 4/4 2/2, and 1/1 artificial layers. Hence, thickness of the film is easily controlled. Enhancement of the dielectric constant is achieved as a result of the interface. Dielectric constants near 900 are achieved for 250 Angstrom thick super lattices. MBE, molecular beam epitaxy or ALCVD, atomic layer CVD techniques is used for this type layer growth process.

Figure 1B:
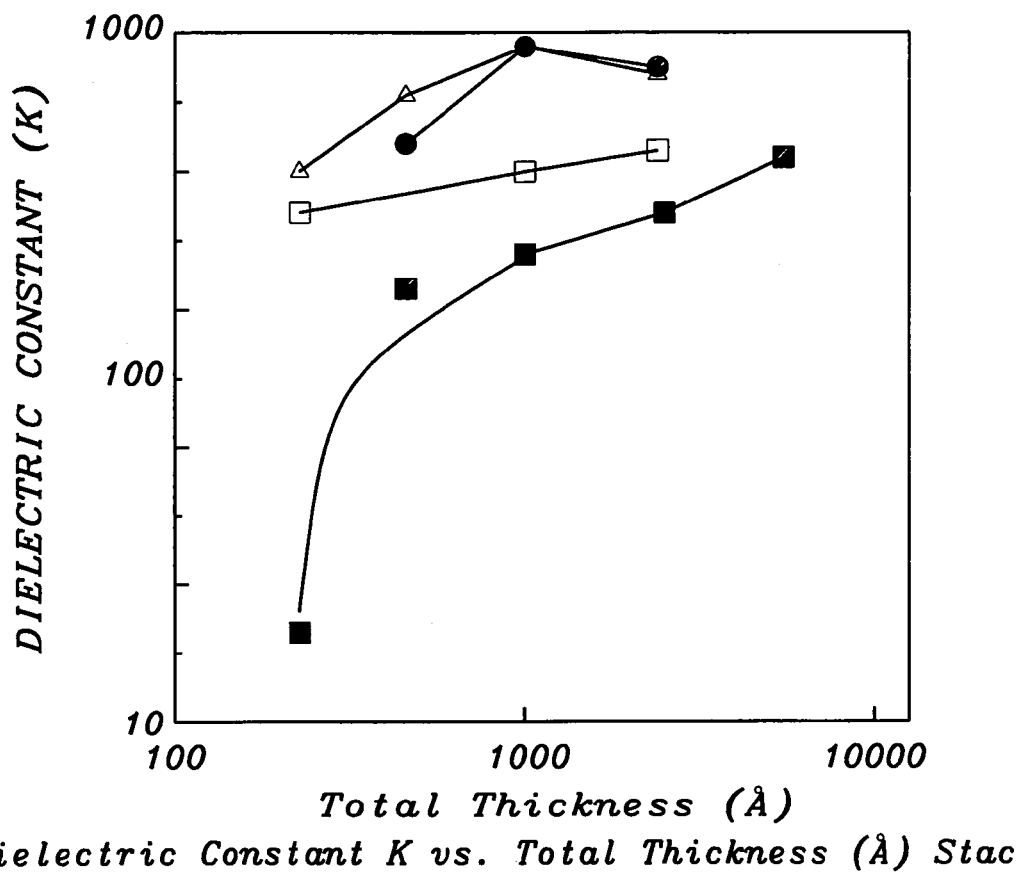

Referring to FIG. 1A, is a graph of dielectric constant, K, versus several titanate stacking dielectrics, illustrating several different stacking configurations:

a one component stacking unit comprised of $(Sr_{0.3}Ba_{0.7})TiO_3$ a two component stacking 2/2 unit comprised of $SrTiO_3$/$BaTiO_3$ a two component stacking 2/2 unit comprised of $(Sr_{0.3}Ba_{0.7})TiO_3$/$(Ca_{0.52}Sr_{0.48})TiO_3$ FIG. 1B, is a graph of dielectric constant, K, versus total dielectric thickness in Angstroms for several titanate compositions and stacking configurations.

Referring to FIG. 1B legend:

[ ] open squares, solid state solution of $SrBaTiO_3$

○ closed circle, 1/1 unit stack

/\ open triangles, 2/2 unit stack

☐ closed squares, 4/4 unit stack

Figure 1C:
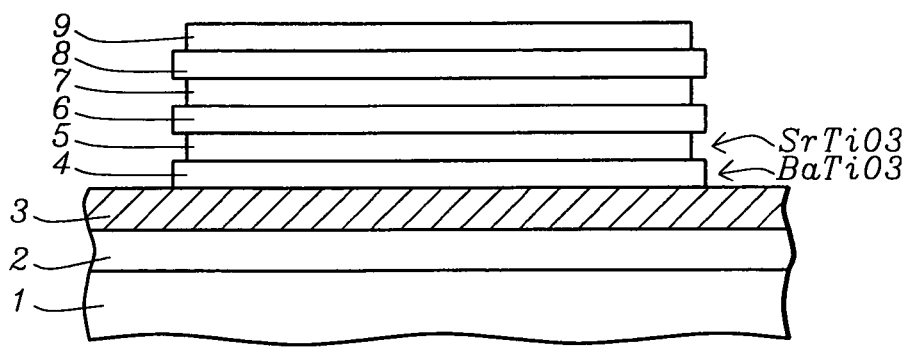

Referring to FIG. 1C, which in cross-sectional representation illustrates a super lattice comprised of 3/3 unit stacking, which is comprised of alternating barium titanate and strontium titanate dielectric layers, forming a $BaTiO_3$/$SrTiO_3$ super lattice. The following layers are formed: 1 semiconductor substrate, comprised of single crystal silicon, having a (100) crystal orientation. Semiconductor device structures are formed in and on the semiconductor substrate. These device structures include gate electrodes, interconnection lines, FET source/drain areas, and low levels of metallization. The semiconductor device structures, not shown, are formed in layer 2, and are covered with an insulator. Next, a bottom capacitor metal electrode 3 (M) for a MIM, metal-insulator-metal capacitor, is formed. Next, the following layers are formed, referred to as "4 through 9" in the FIG. 1C. Firstly, deposition of high k super lattice dielectrics and formation of capacitor insulator (I) for MIM, metal-insulator-metal capacitor is performed. A layer of first $BaTiO_3$ layer 4 for super lattice formation is deposited over the bottom capacitor metal electrode 3, and next a first $SrTiO_3$ layer 5 for super lattice formation over the first $BaTiO_3$ layer 4. Next, a second $BaTiO_3$ layer 6 for super lattice formation over the first $SrTiO_3$ layer 5. Next, a second $SrTiO_3$ layer 7 for super lattice formation over the second $BaTiO_3$ layer 6. Next, a third $BaTiO_3$ layer 8 for super lattice formation over the second $SrTiO_3$ layer 7. Next, a third $SrTiO_3$ layer 9 for super lattice formation over the third $BaTiO_3$ layer 8.

Figure 1D:
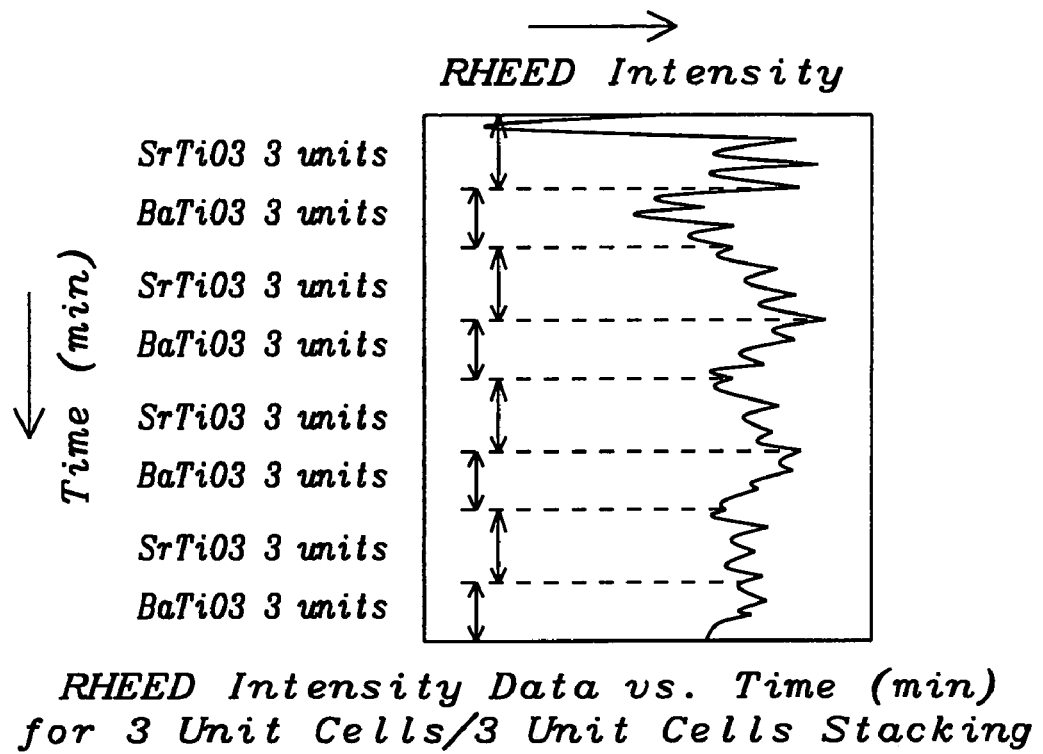

Referring to FIG. 1D, graphs RHEED oscillation intensity versus time during growth of a super lattice, for a a two component alternating stacking of 3/3 units each comprised of $SrTiO_3$/$BaTiO_3$, repeated three times. The sequence in FIG. 1D is as follows, for forming a deposition of high k super lattice dielectrics and in the formation of capacitor insulator (I), for a MIM, metal-insulator-metal capacitor. Starting with a first $SrTiO_3$ 3 unit layer for super lattice formation, then followed by a first $BaTiO_3$ 3 unit layer for super lattice formation over the first $SrTiO_3$ layer. Then, followed by a second $SrTiO_3$ 3 unit layer for super lattice formation over the first $BaTiO_3$ layer, next a second $BaTiO_3$ 3 unit layer for super lattice formation over the second $SrTiO_3$ layer, and then finally a third $SrTiO_3$ 3 unit layer for super lattice formation over the second $BaTiO_3$ layer. For completion: then finally a third $BaTiO_3$ 3 unit layer for super lattice formation over the third $SrTiO_3$ layer.

Figure 2A:
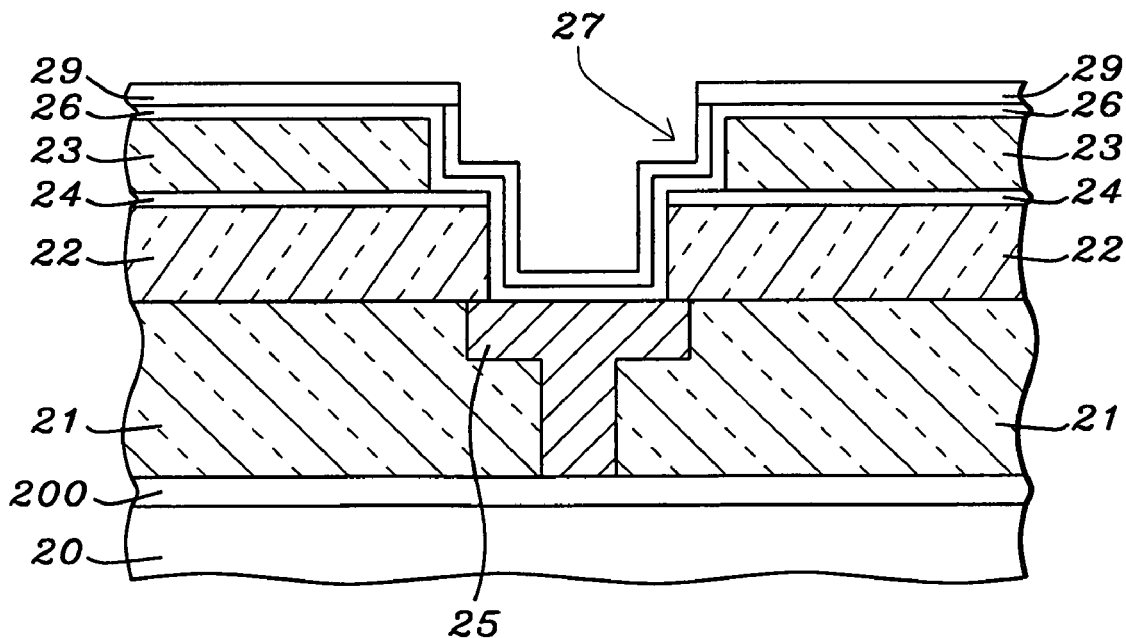
FIGS. 2A–2C, which in cross-sectional representation illustrate the method of the main embodiments of the present invention.
Figure 2B:
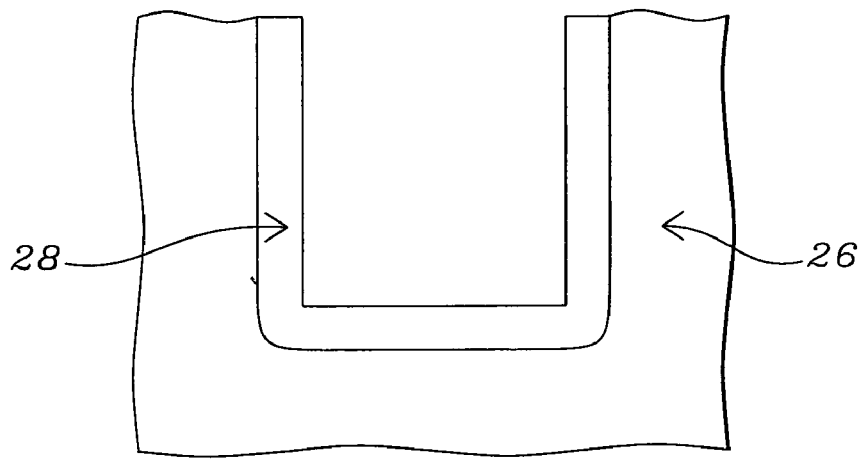
Figure 2C:
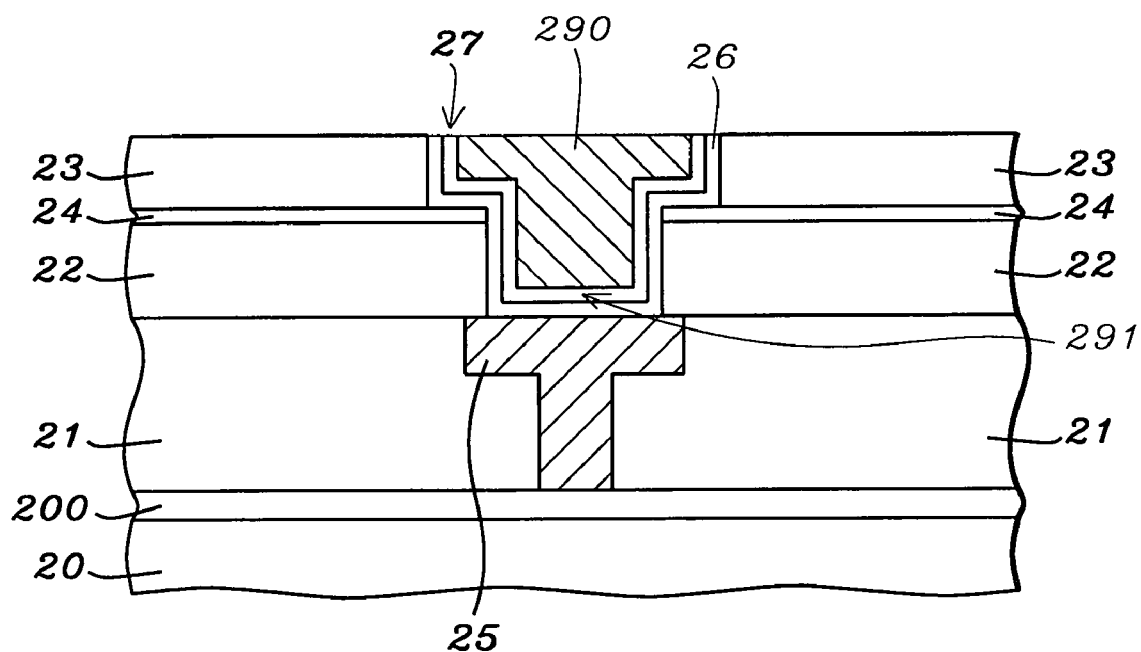

Referring to FIGS. 2A–2C, which in cross-sectional representation illustrate the method of the main embodiments of the present invention.

Referring to FIG. 2A, which in cross-sectional representation illustrates the method of the present invention comprising the formation of a bottom capacitor metal electrode (M) using dual damascene, in combination with CMP, chemical mechanical polishing processes. Also, sketching the deposition of high k super lattice dielectrics and formation of the capacitor insulator (I). The layering starts with providing a semiconductor substrate 20, comprised of single crystal silicon, having a (100) crystal orientation. Semiconductor device structures are formed in and on the semiconductor substrate. These device structures include gate electrodes, interconnection lines, FET source/drain areas, and low levels of metallization. The semiconductor device structures, not shown, are formed in layer 200 and are covered with an insulator. Then the following layering is performed: an insulator, first thick layer, low K material is formed. Next, a second insulator 22, low K material is formed over 21. Next, a third insulator, 23 low K material is formed over 22. Next, a thin etch stop layer (ESL) 24, is formed over 23. Next, a bottom capacitor metal electrode 25 (M) for MIM, metal-insulator-metal capacitor, is formed over 24. This bottom capacitor metal electrode 25 (M) is comprised of copper inlaid metal, for a bottom capacitor plate and is formed by a dual damascene, trench/via process with chemical mechanical polishing back of metal conductor. Next, a thin diffusion barrier layer 26, is blanket deposited over all layers. The key processing step is the formation of a super lattice stack 27, high dielectric constant material in FIG. 2A, over the barrier layer 26. With reference to FIG. 2B, which is an enlarged area sketch of super lattice stack 28, the high dielectric constant material in FIG. 2A. Finally, a "top cap" insulating layer 29, is deposited and is silicon nitride, as shown in FIG. 2A.

Referring to FIG. 2B, which is an enlarged area taken from FIG. 2A, sketched in cross-sectional representation illustrates the key method of the present invention, the deposition of super lattice dielectrics with high dielectric constant insulator, in the formation of capacitor insulator (I). In FIG. 2B, the multi-layered, alternating high dielectric constant material 28 (arrow), is comprised of the super lattice stack components, 27 (arrow).

Referring to FIG. 2C, which in cross-sectional representation illustrates the method of the present invention comprising the formation of a top capacitor metal electrode (M) using dual damascene, in combination with CMP, chemical mechanical polishing processes. Also, sketched is the high k super lattice dielectrics forming the capacitor insulator (I). In addition, in FIG. 2C is sketched the essentials of an entire MIM, metal-insulator-metal, capacitor on a semiconductor substrate, comprised of single crystal silicon, having a (100) crystal orientation. Semiconductor device structures are formed in and on the semiconductor substrate. These device structures include gate electrodes, interconnection lines, FET source/drain areas, and low levels of metallization. The semiconductor device structures, not shown, are formed in layer 200 and are covered with an insulator. Low k dielectric insulating layers are: 21, 22, and 23, respectively with insulating etch stop layer (ESL) 24. Metal barrier layer 26, lines the insulating super lattice (I) 27 (arrow), the high dielectric constant material. Bottom metal electrode (M) is 25, with insulating super lattice (I) 27 (arrow), and top metal electrode (M) 290, together form the MIM, metal-insulator-metal capacitor. Note the shape of the inlaid metal electrodes, comprising "T" shapes, as formed from dual damascene CMP processing, in combination with CMP, chemical mechanical polishing processes. The top metal electrode (290) is formed from a plated layer of copper deposited on copper seed layer, in a copper "gap fill" process that included a planarization of the copper electrode by chemical mechanical polishing, CMP. Still referring to FIG. 2C, one of the key embodiments of the present invention is the high dielectric super lattice material 291 (arrow) in the area or region in between the two electrodes: top (290) and bottom (25) electrodes, specifically in area 291 (arrow), that serves as the major contributor to the capacitance value of the MIM capacitor.

Figure 3:
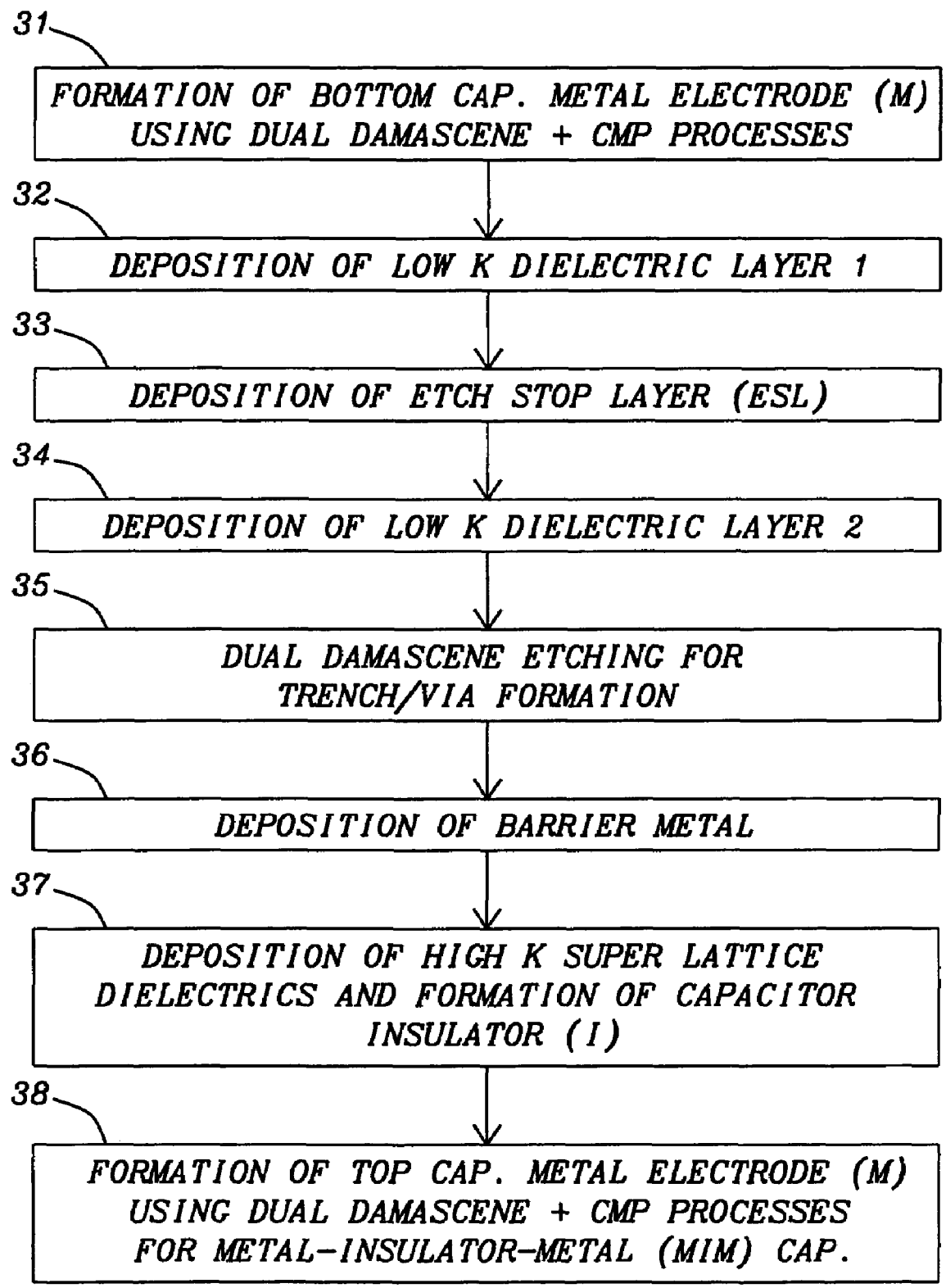
FIG. 3 is a flow chart of the general method of the present invention.

FIG. 3 is a flow chart of the general method of the present invention. Starting with formation of bottom cap metal electrode (M) 31 which uses a dual damascene+amp processes for formation. Then, the deposition of the first low k dielectric layer 32, deposition of etch stop layer (ESL) 33, deposition of the second low k dielectric layer 34, followed by dual damascene etching for trench/via formation 35, deposition of barrier metal 36, deposition of high k super lattice dielectrics forming the capacitor insulator (I) 37, and finally the formation of top capacitor metal electrode (M) using dual damascene and chemical mechanical polishing CMP processes, to form the complete metal-insulator-metal (MIM) capacitor.

Note, the super lattice dielectric properties depend on growth temperature and deposition conditions. Please specify the growth temperature and deposition conditions for super lattices. For ALCVD, the growth temperature is typically 300 to 500° C., with pressure ranging from 1 milli-Torr to 10 Torr.

A summary of the key layers for MIM capacitor processing and process details are:

(a) The dielectric layers are a low dielectric constant material or materials selected from the group consisting of: SiN, SiO, spin-on-glass SOG, PE plasma enhanced TEOS, tetraethoxysilane deposition, halogenated SiO, fluorinated silicate glass (FSG), in a thickness range from 1000 to 10000 Angstroms, deposited by chemical vapor deposition or by spinning on glass for spin-on-glass SOG.

(b) The first metal electrode layer is selected from group consisting of metals and metal alloys with high conductivity, deposited by physical vapor deposition and plating: copper, copper alloys; aluminum and aluminum alloys, platinum and platinum alloys, palladium and alloys, gold and gold alloys, silver and silver alloys, with a thickness range from 1000 to 20000 Angstroms and for copper, seed layer thickness from 500 to 1500 Angstroms, with plated copper thickness from 10000 to 20000 Angstroms, forming a bottom metal electrode overlying an intermetal dielectric layer.

(c) The capacitor dielectric insulator with high dielectric constant material or materials, alternating material layers and forming a super lattice stack, with stacking units of 1/1, 2/2, 3/3, 4/4, comprises a material or materials selected from the group consisting of: $(Sr_{0.3}Ba_{0.7})TiO_3$, $SrTiO_3/BaTiO_3$, $(Sr_{0.3}Ba_{0.7})TiO_3/(Ca_{0.52}Sr_{0.48})TiO_3$, $BaTiO_3/SrTiO_3$, $BaTiO_3/BaHfO_3$, $BaTiO_3/BaZrO_3$, $Ba_{0.5}Sr_{0.5}TiO_3$, with layering stack of $[(BaTiO_3)4/(SrTiO_3)4]_4$, $Ta_2O_5/HfO_2$, $Ta_2O_5/ZrO_2$, $Ta_2O_5/HfO_2, Ta_2O_5/ZrO_2$, and ferroelectric/antiferroelectric materials.

(d) The capacitor dielectric insulator with high dielectric constant material or materials are formed by using Molecular Beam Epitaxy or Atomic Layering Chemical Vapor Deposition techniques, alternating material layers and forming a super lattice stack, with stacking units of 1/1, 2/2, 3/3, 4/4, having high dielectric constants based on the growth temperature, with thickness in the range between 0.1 to 2 microns, and deposition temperatures between 300 to 500° C., with pressure ranging from 1 milli-Torr to 10 Torr.
(e) The metal barrier layer is selected from the group consisting of: TaN and W deposited by chemical vapor deposition, with thickness in the range between 500 to 1000 Angstroms.
(f) The capacitor dielectric insulator with high dielectric constant material or materials, alternating material layers and forming a super lattice stack, are comprised of material or materials selected from the group consisting of: super lattice stack starting with $HfO_2$, as the bottom starting stack material, formed on SiN, silicon nitride, for good adhesion properties.
(g) The second metal electrode layer is selected from group consisting of metals and metal alloys with high conductivity, deposited by physical vapor deposition and plating: copper, copper alloys, aluminum and aluminum alloys, platinum and platinum alloys, palladium and alloys, gold and gold alloys, silver and silver alloys, with a thickness range from 1000 to 20000 Angstroms and for copper, seed layer thickness from 500 to 1500 Angstroms, with plated copper thickness from 10000 to 20000 Angstroms, forming a top metal electrode.

While the invention has been particularly shown and described with reference to the preferred embodiments thereof, it will be understood by those skilled in the art that various changes in form and details may be made without departing from the spirit and scope of the invention.

What is claimed is:

1. An integrated circuit metal-insulator-metal capacitor device comprising:
    (a) a semiconductor substrate, having a first dielectric insulator layer of the substrate;
    (b) a plurality of dual damascene trench and via openings in said first dielectric insulator layer for bottom metal electrodes;
    (c) bottom metal capacitor electrodes formed in trench and via openings flush with the surface of the first dielectric insulator layer;
    (d) a second dielectric insulator layer;
    (e) a plurality of dual damascene trench and via openings in said second dielectric insulator layer;
    (f) a metal barrier layer over the second dielectric insulator layer;
    (g) a high dielectric constant insulator in trench and via openings over the metal barrier layer, wherein said insulator is for the capacitors and is a super lattice stack of atomic unit cells;
    (h) top metal capacitor electrodes formed over said high dielectric constant insulator, and filling trench and via openings, planar to the surface of the second dielectric insulator layer, completing metal-insulator-metal capacitor structures.

2. The metal-insulator-metal capacitor structure of claim 1, wherein said first and second dielectric insulator layers are a low dielectric constant material selected from the group consisting of: SiN, SiO, spin-on-glass SOG, PE plasma enhanced TEOS, tetraethoxysilane deposition, halogenated SiO, fluorinated silicate glass (FSG), in a thickness range from 1000 to 10000 Angstroms.

3. The metal-insulator-metal capacitor structure of claim 1, wherein said bottom metal capacitor electrodes are selected from group consisting of metals and metal alloys with high conductivity, deposited by physical vapor deposition and plating: copper, copper alloys, aluminum and aluminum alloys, platinum and platinum alloys, palladium and alloys, gold and gold alloys, silver and silver alloys, with a thickness range from 1000 to 20000 Angstroms and for copper, seed layer thickness from 500 to 1500 Angstroms, with plated copper thickness from 10000 to 20000 Angstroms, forming a bottom metal electrode overlying a dielectric layer.

4. The metal-insulator-metal capacitor structure of claim 1, wherein said capacitor dielectric insulator with high dielectric constant material, has alternating layers forming a super lattice stack of atomically aligned atomic unit cells, with cell stacking order of: 1 unit cell monolayer over 1 unit cell monolayer, or alternately 2 unit cells over 2 unit cells, or alternately 3 unit cells over 3 unit cells, or alternately 4 unit cells over 4 unit cells, comprises a material selected from the group consisting of: $(Sr_{0.3}Ba_{0.7})TiO_3$, $SrTiO_3/BaTiO_3$, $(Sr_{0.3}Ba_{0.7})TiO_3/(Ca_{0.52}Sr_{0.48})/TiO_3$, $BaTiO_3/SrTiO_3$, $BaTiO_3/BaHfO_3$, $BaTiO_3/BaZrO_3$, $Ba_{0.5}Sr_{0.5}TiO_3$, with layering stack of $[(BaTiO_3)4/(SrTiO_3)4]_4$, $Ta_2O_5/HfO_2$, $Ta_2O_5/ZrO_2$, and ferroelectric/antiferroelectric materials.

5. The metal-insulator-metal capacitor structure of claim 1, wherein said metal barrier layer is selected from the group consisting of: TaN and W, with thickness in the range between 500 to 1000 Angstroms.

6. The metal-insulator-metal capacitor structure of claim 1, wherein said capacitor dielectric insulator, forming a super lattice stack, with atomically aligned layers of unit cells starting with $HfO_2$, as the bottom starting unit cell stack material, is formed on a silicon nitride layer, for good adhesion properties.

7. The metal-insulator-metal capacitor structure of claim 1, wherein said top metal capacitor electrodes are selected from group consisting of metals and metal alloys with high conductivity: copper, copper alloys, aluminum and aluminum alloys, platinum and platinum alloys, palladium and alloys, gold and gold alloys, silver and silver alloys, with a thickness range from 1000 to 20000 Angstroms and for copper, formed as a top metal capacitor electrode.

8. The metal-insulator-metal capacitor structure of claim 1, wherein said first and second metal electrode layers are formed in a dual damascene openings, and metal-insulator-metal (MIM)/Inductors structures can form multilevel structures by repeating the formation of the said structures described herein, by repeating steps (b) through (h).

* * * * *